(12) United States Patent
Culmsee et al.

(10) Patent No.: US 7,364,975 B2
(45) Date of Patent: Apr. 29, 2008

(54) SEMICONDUCTOR DEVICE FABRICATION METHODS

(75) Inventors: Marcus Culmsee, Wappingers Falls, NY (US); Frank Weber, Egmating (DE); Josef Maynollo, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 91 days.

(21) Appl. No.: 11/490,301

(22) Filed: Jul. 20, 2006

(65) Prior Publication Data

US 2008/0020534 A1 Jan. 24, 2008

(51) Int. Cl.
*H01L 21/336* (2006.01)
*H01L 21/76* (2006.01)
*H01L 21/8238* (2006.01)

(52) U.S. Cl. ............... 438/296; 438/424; 438/435; 438/221; 257/501; 257/E21.546; 257/E21.548

(58) Field of Classification Search ............. 438/296, 438/424, 435, 221; 257/501, E21.546, E21.548
See application file for complete search history.

(56) References Cited

U.S. PATENT DOCUMENTS

| | | | |
|---|---|---|---|
| 5,480,763 A | 1/1996 | Kondo et al. | |
| 6,171,896 B1 | 1/2001 | Jang et al. | |
| 6,171,962 B1 | 1/2001 | Karlsson et al. | |
| 6,210,846 B1 | 4/2001 | Rangarajan et al. | |
| 6,251,783 B1 | 6/2001 | Yew et al. | |
| 6,265,302 B1 | 7/2001 | Lim et al. | |
| 6,531,377 B2* | 3/2003 | Knorr et al. | 438/435 |
| 6,667,223 B2 | 12/2003 | Seitz | |
| 6,821,865 B2* | 11/2004 | Wise et al. | 438/435 |
| 6,914,015 B2* | 7/2005 | Belyansky et al. | 438/788 |
| 7,163,869 B2* | 1/2007 | Kim et al. | 438/424 |
| 7,244,658 B2* | 7/2007 | Yieh et al. | 438/424 |
| 7,279,377 B2* | 10/2007 | Rueger et al. | 438/222 |
| 2001/0049179 A1 | 12/2001 | Mori | |
| 2003/0013271 A1* | 1/2003 | Knorr et al. | 438/435 |
| 2005/0095872 A1* | 5/2005 | Belyansky et al. | 438/778 |
| 2007/0026629 A1* | 2/2007 | Chen et al. | 438/424 |
| 2007/0037341 A1* | 2/2007 | Rueger et al. | 438/222 |

OTHER PUBLICATIONS

Gruening, U., et al., "A Novel Trench DRAM Cell with a VERtIcal Access Transistor and BuriEd STrap (VERI BEST) for 4Gb/16Gb," 1999, 4 pp., IEEE, Los Alamitos, CA.
Kersch, A., et al., "Recent Advances in Feature Scale Simulation," IEDM, 2000, pp. 503-506, IEEE, Los Alamitos, CA.
Radens, C.J., et al., "An Orthogonal $6F^2$ Trench-Sidewall Vertical Device Cell for 4Gb/16Gb DRAM," 2000, 4 pp., IEEE, Los Alamitos, CA.

* cited by examiner

*Primary Examiner*—Michael Lebentritt
*Assistant Examiner*—Mohsen Ahmadi
(74) *Attorney, Agent, or Firm*—Slater & Matsil, L.L.P.

(57) ABSTRACT

Methods of fabricating semiconductor devices are disclosed. In a preferred embodiment, a method of fabricating a semiconductor device includes providing a workpiece including a plurality of active area regions defined therein, and forming at least one trench in the workpiece between at least two of the plurality of active area regions. A first insulating material is deposited over the plurality of active area regions and the at least one trench, partially filling the at least one trench with the first insulating material and forming peaks of the first insulating material over the plurality of active area regions. A masking material is formed over the first insulating material in the at least one trench, leaving the peaks of the first insulating material over the plurality of active area regions completely exposed. At least the peaks of the first insulating material are removed from over the plurality of active area regions.

22 Claims, 7 Drawing Sheets

SEMICONDUCTOR DEVICE FABRICATION METHODS

TECHNICAL FIELD

The present invention relates generally to the fabrication of semiconductor devices, and more particularly to the fabrication of isolation structures of semiconductor devices.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor substrate or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip, for example.

Isolation regions are used to provide electrical isolation between active areas or electronic components formed on an integrated circuit. Shallow trench isolation (STI) and deep trench (DT) isolation are examples of some types of isolation regions that are widely used in semiconductor devices.

STI regions are often used in complementary metal oxide semiconductor (CMOS) devices, which use both positive and negative channel devices in complementary configurations. The positive and negative channel devices of a CMOS device are typically referred to as a p channel metal oxide semiconductor (PMOS) transistor and an n channel metal oxide semiconductor (NMOS) transistor. The PMOS transistor is formed in an n well (e.g., a well implanted with n type dopants) and the NMOS transistor is formed in a p well, for example. An STI region is usually formed between the n well and p well of the PMOS transistor and the NMOS transistor, respectively. The STI region usually extends within a semiconductor substrate by about the depth of the maximum n well and p well doping concentration, e.g., by about 0.2 to 1.0 μm, for example.

In memory devices, STI regions are used to separate the element regions of a memory array, e.g., such as an array of dynamic random access memory (DRAM) cells. The element regions may include active areas, storage capacitors, and other electronic devices such as transistors. In some designs, STI regions define the bitline contact landing area in a vertical DRAM cell. The STI regions also prevent cross-talk between two neighboring DRAM cells connected via the same wordline, for example, which ensures that only one cell is modified when being written to by accessing one row and a corresponding column in the DRAM array, for example. STI regions are also used in other types of memory devices, such as static random access memory (SRAM) devices.

To form isolation regions, trenches are usually formed in a substrate or workpiece, and the trenches are filled with one or more insulating materials. Etch processes and chemical mechanical polishing (CMP) processes are typically used to remove excess insulating material from the top surface of the substrate.

One problem that often occurs in the formation of isolation regions is the formation of recesses or voids in the insulating material used to fill the trenches. The lack of insulating material in the recessed or voided areas can result in inadequate electrical isolation between active areas, and can result in shorts if conductive material is subsequently deposited in the recessed or void areas. Furthermore, it is generally desirable for the topography of the top surface of a substrate to be planar, to improve subsequent lithography and CMP processes, for example.

As semiconductor device features are decreased in size, as is the trend in the industry, high aspect ratio trenches are more frequently used, wherein the depth of the trenches is greater than the width, for example. Void formation is frequently a problem in isolation regions formed in trenches having a high aspect ratio.

Thus, what are needed in the art are improved methods of forming isolation regions of semiconductor devices.

SUMMARY OF THE INVENTION

These and other problems are generally solved or circumvented, and technical advantages are generally achieved, by preferred embodiments of the present invention, which provide novel methods of forming isolation regions of semiconductor devices.

In accordance with a preferred embodiment of the present invention, a method of fabricating a semiconductor device includes providing a workpiece, the workpiece including a plurality of active area regions defined therein, and forming at least one trench in the workpiece between at least two of the plurality of active area regions. A first insulating material is deposited over the plurality of active area regions and the at least one trench of the workpiece, partially filling the at least one trench with the first insulating material and forming peaks of the first insulating material over the plurality of active area regions. A masking material is formed over the first insulating material in the at least one trench, leaving the peaks of the first insulating material over the plurality of active area regions completely exposed. At least the peaks of the first insulating material are removed from over the plurality of active area regions of the workpiece.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
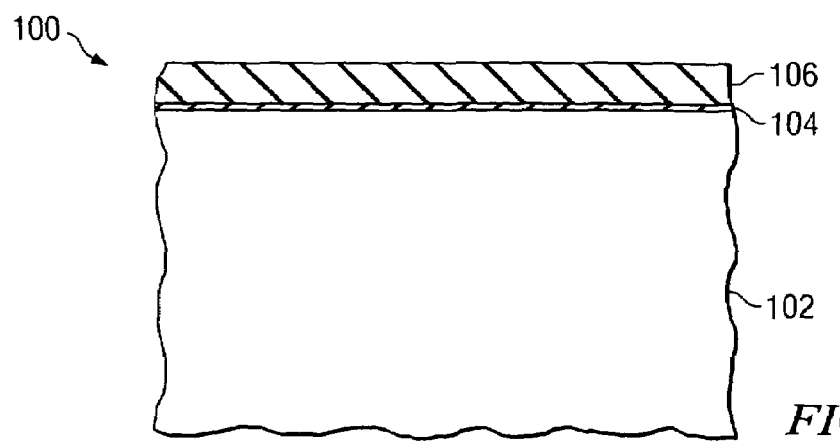
FIGS. 1 through 10 show cross-sectional views of a method of forming a semiconductor device at various stages of manufacturing in accordance with a preferred embodiment of the present invention, wherein peaks of a first insulating material are completely exposed through a masking material, and then the exposed peaks of the first insulating material are removed.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

High density plasma (HDP) oxide is an insulating material often used to form isolation structures. HDP oxide has good insulating properties and the stress of the material is compatible with the stress of the surrounding silicon in a substrate, for example. It is desirable to fill trenches in a substrate with the HDP oxide without voids to form isolation structures, in some semiconductor device designs.

However, HDP oxide deposition results in the formation of peaks or huts on top surfaces of a substrate, due to the nature of the chemical vapor deposition (CVD) process and the HDP process used to deposit the material. High aspect ratio trenches cannot be filled in a single deposition step using HDP oxide as an insulating material, because the peaks result in the creation of voids in the HDP oxide. Furthermore, the peaks create or worsen a high aspect ratio of trenches by adding a height over the top surface of a substrate, making additional fill steps difficult and resulting in a tendency to form voids in and over the trenches. Thus, it is desirable to remove the HDP oxide peaks over top surfaces of a substrate, yet leave the HDP oxide remaining within trenches.

Other insulating materials such as HARP™ (high aspect ratio process), a highly conformal tetra ethyl oxysilane (TEOS)/ozone process developed by Applied Materials, have been proposed for use in isolation structures. However, HDP oxide is preferred in many applications because of its stress properties, whereas HARP™ has a different stress behavior than HDP oxide. Stress behavior of insulating materials in isolation structures may lead to a shift in device characteristics, such as $I_{on}/I_{off}$ in transistors, as an example.

Furthermore, HARP™ requires the use of special deposition tools, requiring the replacement of HDP oxide deposition tools, which is costly.

Embodiments of the present invention achieve technical advantages by providing novel methods of forming isolation regions of semiconductor devices. After the formation of an insulating material that forms peaks over top surfaces of a workpiece and partially fills trenches in the workpiece, a masking material is deposited. A top portion of the masking material is then removed to completely expose the peaks of the insulating material. The completely exposed peaks of the insulating material above the top surface of the workpiece are then etched away, while the masking material within the trenches prevents the insulating material from being removed from the trenches in the workpiece.

The present invention will be described with respect to preferred embodiments in a specific context, namely in the formation of shallow trench isolation (STI) regions of semiconductor devices. The invention may also be applied, however, to the formation of other types of isolation structures, such as deep trench (DT) isolation, as an example. Embodiments of the present invention may also be used in the fabrication of other isolation structures, or combinations thereof, for example.

FIGS. 1 through 10 show cross-sectional views of a method of forming a semiconductor device 100 at various stages of manufacturing in accordance with a preferred embodiment of the present invention. Referring to FIG. 1, first, a workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, capacitors, etc., not shown. Compound semiconductors, GaAs, InP, Si/Ge, or SiC, as examples, may be used in place of silicon. The workpiece 102 may also comprise bulk Si, SiGe, Ge, SiC, or a silicon-on-insulator (SOI) substrate, as examples.

An optional pad oxide 104 may be formed on the top surface of the workpiece 102, as shown in FIG. 1. The pad oxide 104 may be formed by thermal oxidation, e.g., by heating the workpiece 102 while exposing the workpiece 102 to oxygen, or alternatively, the pad oxide 104 may be deposited, as examples. The pad oxide 104 preferably comprises silicon dioxide having a thickness of about 50 Å, although alternatively, the pad oxide 104 may comprise other materials and dimensions, for example. The pad oxide 104 functions as an adhesion layer between the workpiece 102 and a subsequently-deposited pad nitride 106, for example.

A pad nitride 106 is formed over the pad oxide 104, or over the workpiece 102 if a pad oxide 104 is not included, for example. The pad nitride 106 is also referred to herein as a sacrificial material 106, for example. The pad nitride 106 functions as a stop layer for a subsequent chemical-mechanical polish (CMP) process, for example, and also has several functions for embodiments of the present invention, to be described further herein. The pad nitride 106 preferably comprises silicon nitride having a thickness of about 900 Å, for example. Alternatively, the pad nitride 106 may comprise a sacrificial material 106 comprising other materials and dimensions, for example. The sacrificial material 106 preferably comprises a material that may be etched selectively to a subsequently-deposited insulating fill material (see first insulating material 118 in FIG. 4 and second insulating material 132 in FIG. 10, to be described further herein), and may alternatively comprise an oxynitride or other insulating material, as examples.

Figure 2:
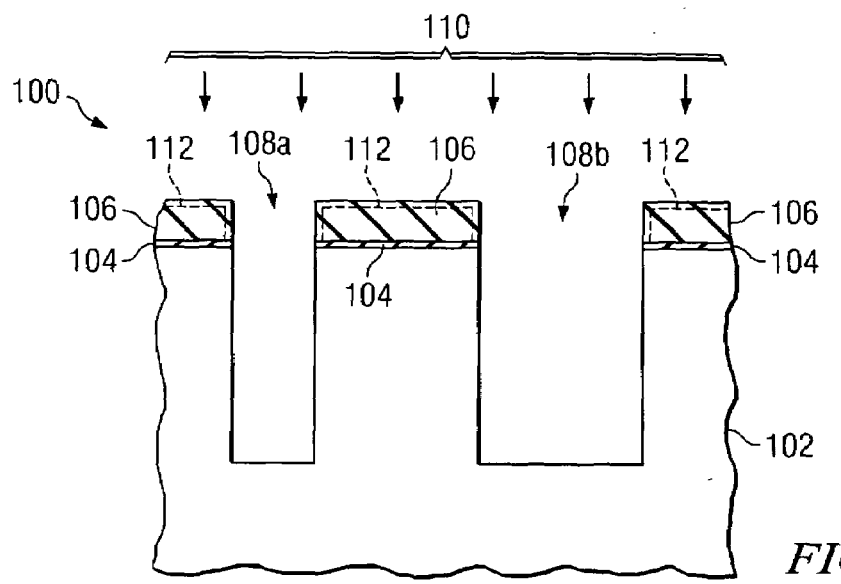

At least one trench 108a and 108b, e.g., and in some embodiments, preferably a plurality of trenches 108a and 108b, are formed in the workpiece 102, and also in the pad oxide 104 and the pad nitride 106, if present, as shown in FIG. 2. The trenches 108a and 108b are preferably formed using lithography, e.g., by depositing a layer of photosensitive material (not shown) over the workpiece 102, patterning the layer of photosensitive material using a lithography mask (also not shown). For example, a pattern for the trenches 108a and 108b is transferred to the workpiece 102 to form the trenches 108a and 108b, by exposing the layer of photosensitive material to light or energy through the lithography mask, for example. The layer of photosensitive material is then developed, and exposed portions of the layer of photosensitive material are then removed or stripped, and the layer of photosensitive material is used as a mask while portions of the workpiece 102 (and pad oxide 104 and pad nitride 106, if present) are etched away. The etch process to form the trenches 108a and 108b may comprise a dry etch process, a reactive ion etch (RIE) process, or other type of etch process, as examples.

The trenches 108a and 108b may comprise a width of about 20 nm to several μm, for example, although the width of the trenches 108a and 108b may comprise other dimensions. The trenches 108a and 108b may vary in size and shape across a workpiece 102, depending on the application. Some trenches 108a and 108b may comprise a width comprising about a minimum feature size (as shown at 108a), or greater than a minimum feature size (as shown at 108b), of the semiconductor device 100 and lithography system used to pattern the trenches 108a and 108b, for example. The trenches 108a and 108b may comprise a depth from the top surface of the workpiece 102 of about 200 to 500 nm in some applications, although the depth of the trenches 108a and 108b may also comprise about 0.2 to 10 μm or greater, for example.

Preferably a plurality of trenches 108a and 108b, e.g., two or more trenches 108a and 108b, are formed in the workpiece 102. There may be hundreds or thousands of trenches 108a and 108b formed across a surface of a workpiece 102, for example. The plurality of trenches 108a and 108b may comprise a plurality of round, elliptical, square, or rectangular shaped trenches 108a and 108b, for example. Alternatively, the plurality of trenches 108a and 108b may comprise other shapes. Each of the plurality of trenches 108a and 108b comprises sidewalls, a bottom surface, a lower portion, and an upper portion. At least some of the trenches 108a and 108b may have a high aspect ratio, wherein the depth is greater than the width.

The plurality of trenches 108a and 108b may comprise substantially vertical sidewalls, as shown. Alternatively, the plurality of trenches 108a and 108b may comprise sidewalls that taper inwardly and downwardly, being wider at the top than at the bottom, or they may be wider at the bottom than at the top, not shown.

Next, in some embodiments, in an optional step, the pad nitride 106 is etched or pulled back, preferably using an isotropic or non-directional etch process 110, as shown in FIG. 2. The etch process 110 may comprise a wet etch process, for example. Preferably about 20 to 30 Å of the pad nitride 106 is removed, e.g., from the sides and top surface of the pad nitride 106, as shown at 112, although alternatively, other amounts (e.g., smaller or larger amounts) of the pad nitride 106 may be removed.

After the etch-back process of the pad nitride 106, a step is created between the pad oxide 104 and the pad nitride 106, e.g., the pad nitride 106 is reduced in a lateral dimension compared to the pad oxide 104 and the workpiece 102 after the pad nitride 106 etch-back process, as shown. The pad nitride 106 is etched back to increase the size of the openings of the upper portion of the trenches 108a and 108b, to facilitate the formation of liners 114 and 116 (see FIG. 3) and the deposition of the insulating materials 118 (see FIG. 4) and 132 (see FIG. 10), to be described further herein.

Figure 3:
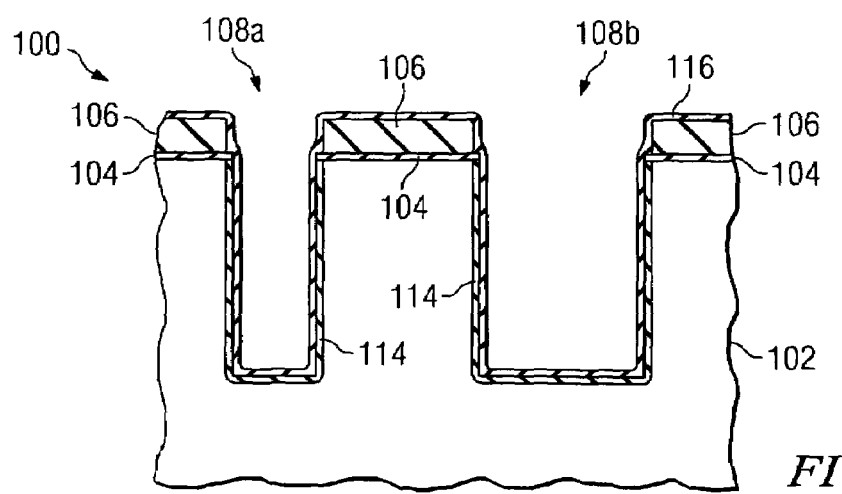

An optional oxide liner 114 may next be formed on at least the sidewalls of the trenches within the workpiece 102, as shown in FIG. 3. The oxide liner 114 is preferably thermally grown, e.g., by heating the workpiece 102 while exposing the workpiece 102 to oxygen, for example. Thermally growing the oxide liner 114 is preferable in some embodiments, to avoid forming the oxide liner 114 on the pad oxide 104 or pad nitride 106, for example, which will not oxidize as readily or quickly as the workpiece 102, which may comprise silicon, for example. Alternatively, the oxide liner 114 may be deposited, for example, also being formed on the sidewalls of the pad oxide 104 and the sidewalls and top surface of the pad nitride 106 (not shown). The oxide liner 114 preferably comprises silicon dioxide comprising a thickness of about 50 to 70 Å, although alternatively, the liner 114 may comprise other materials and dimensions.

A nitride liner 116 is formed over the oxide liner 114 within the trenches 108a and 108b, and over the sidewalls of the pad oxide 104, if present, and over the sidewalls and top surface of the pad nitride 106, as shown in FIG. 3. The nitride liner 116 may be formed by low pressure chemical vapor deposition (LPCVD) or other deposition methods, for example, and preferably comprises about 130 Å of silicon nitride, although alternatively, other deposition methods, materials, and dimensions may be used. The liner 116 preferably comprises a material that may be etched selectively to a subsequently-deposited insulating fill material (see first insulating material 118 in FIG. 4 and second insulating material 132 in FIG. 10, to be described further herein), and may alternatively comprise an oxynitride or other insulating material, as examples.

Figure 4:
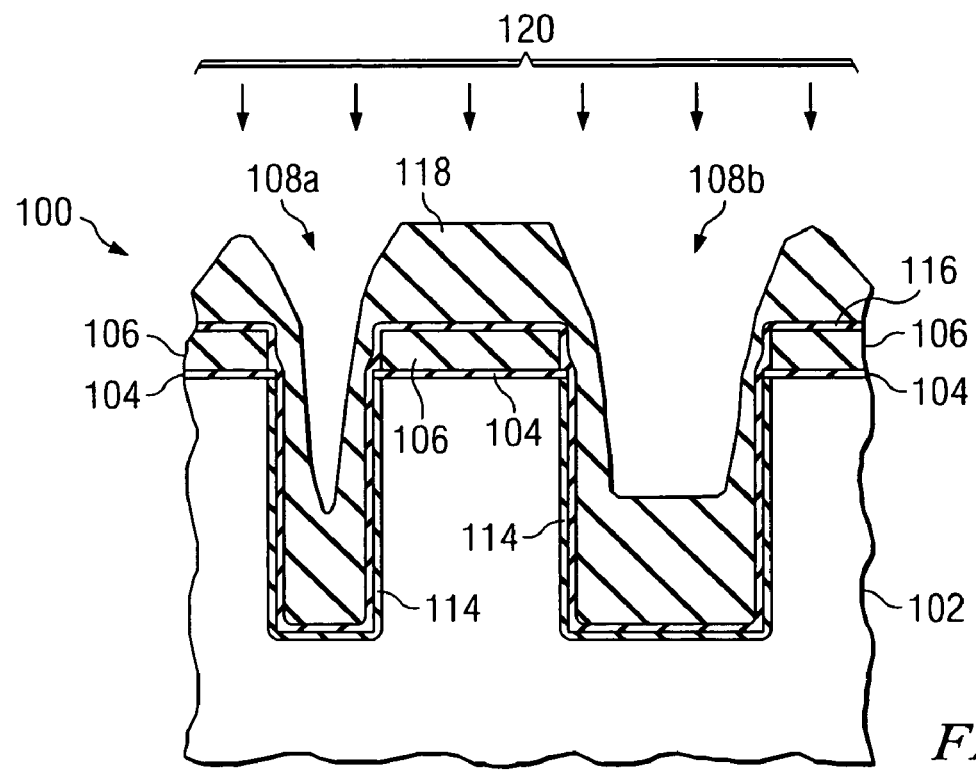

Referring next to FIG. 4, in a first fill step of two or more fill steps to fill the trenches 108a and 108b, a first insulting material 118 is formed over the workpiece 102, partially filling the trenches 108a and 108b with the first insulating material 118 and forming peaks of the first insulating material 118 over the top surface of the workpiece 102, e.g., over the top surface of the pad nitride 106, or over the nitride layer 116, if present. The first insulating material 118 preferably comprises silicon dioxide formed using high density plasma (HDP) CVD. The first insulating material 118 preferably comprises HDP oxide, in some embodiments, for example. Alternatively other insulating materials may be used and deposited using other methods, for example.

Due to the nature of the HDP CVD oxide deposition process, the process comprises a non-conformal deposition process, forming a thicker insulating layer over top surfaces than sidewalls of the trenches 108 and 108b, for example. The first insulating material 118 may fill the trenches by at least a third of the trench 108a and 108b depth below a top surface of the workpiece 102, and may fill the trenches by at least half of the trench 108a and 108b depth below a top surface of the workpiece 102, for example. Although it would be preferable to completely fill the trenches 108a and 108b completely in one deposition step, because the HDP CVD oxide deposition would tend to form voids if this were attempted, preferably the trenches are only partially filled in this deposition step, for example, to avoid the formation of voids in the HDP oxide. As deposited, the first insulating material 118 is thicker and forms peaks over the top surface of the workpiece 102 and in the bottom portion of the trenches 108a and 108b. The first insulating material 118 is thicker over the top surface of the workpiece 102 than on sidewalls of the top portion of the trenches 108a and 108b. The peaks are only formed over the top surface of the workpiece 102, as shown.

Figure 10:
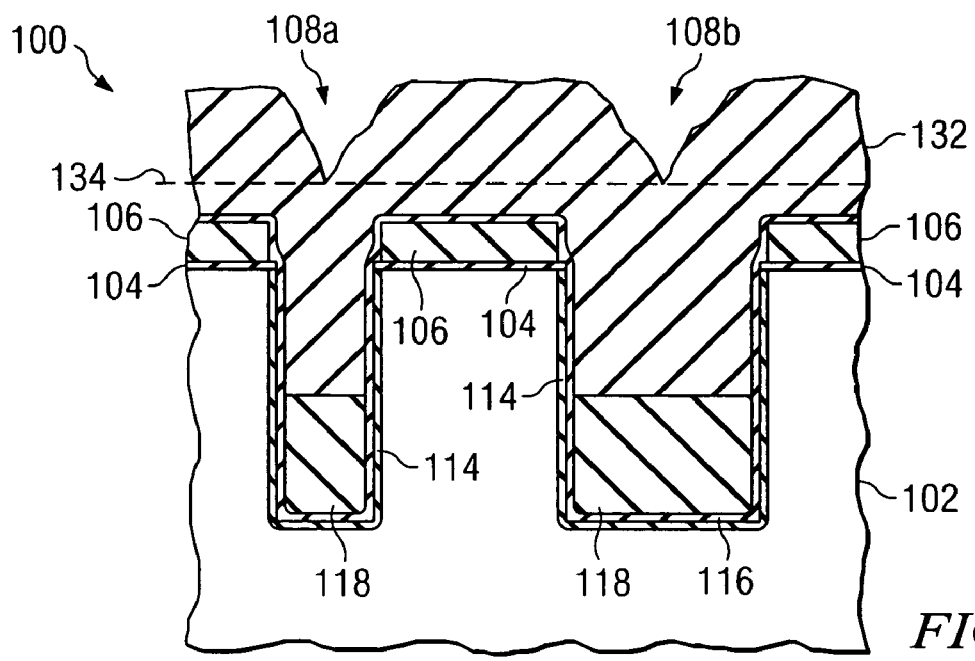

Next, in an optional step, the first insulating material 118 is partially etched back to remove the first insulating material 118 from the sidewalls of the top portion of the trenches 108a and 108b, in order to improve a second fill step in a later manufacturing process (as shown in FIG. 10, to be described further herein). The first insulating material 118 is etched back, e.g., using an etch process 120 that is isotropic (e.g., highly conformal), as shown in FIG. 4. The etch process 120 preferably comprises a wet etch process, for example, although other types of etch processes may also be used.

Due to the nature the of the etch process 120, a substantially equal amount of material is removed from the first insulating material 118 on the sidewalls and bottom of the trenches 108 and 108b and from the pad nitride 106. As the deposition process of the first insulating material 118 is of a non-conformal character, the first insulating material 118 on the sidewalls of the top portion of the trenches 108a and 108b is removed completely, while only a small amount of the first insulating material 118 at the bottom of the trenches 108a and 108b and over the pad nitride 106 is removed. For example, the first insulating material 118 is preferably removed from the sidewalls of the nitride liner 116, the pad nitride 106, and/or the pad oxide 104, if present. The etch process 120 may comprise removing about 350 Å or less of the first insulating material 118 using a BHF wet etch process, for example.

Figure 5:
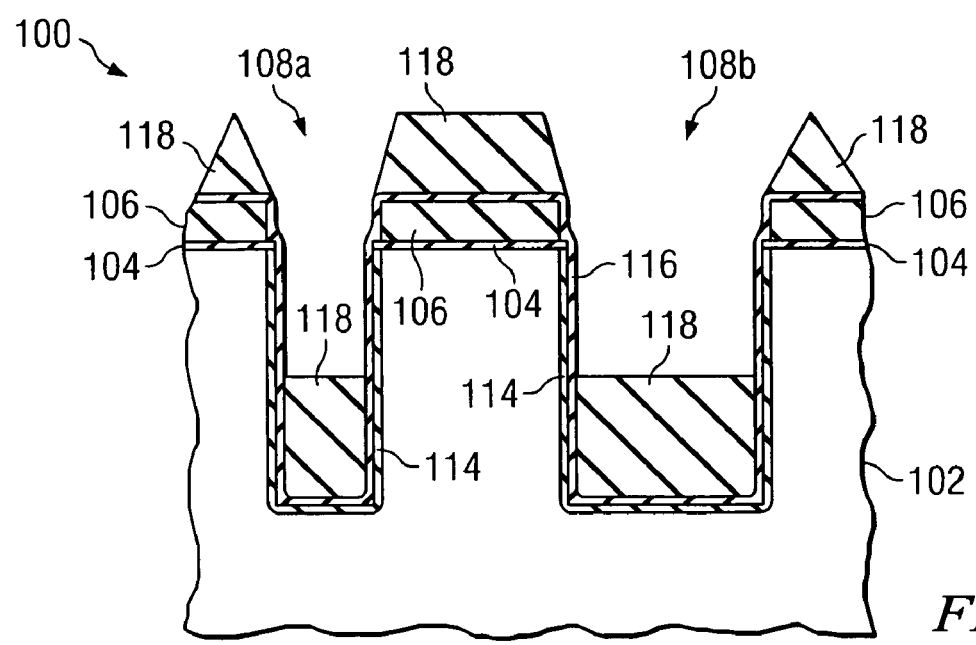

Thus, in some embodiments, the first insulating material 118 is also removed from the sidewalls of the upper portion of the trenches 108a and 108b formed in the workpiece 102, for example, as shown in FIG. 5. The optional liners 114 and 116 are advantageous in these embodiments, because the liners 114 and/or 116 protect the sidewalls of the upper portion of the trenches 108a and 108b within the workpiece 102 from being exposed to the etch process 120 to etch back the first insulating material 118, for example. The upper portion of the workpiece 102 may comprise active area regions that may be damaged when exposed to strong etch processes, for example.

Figure 6:
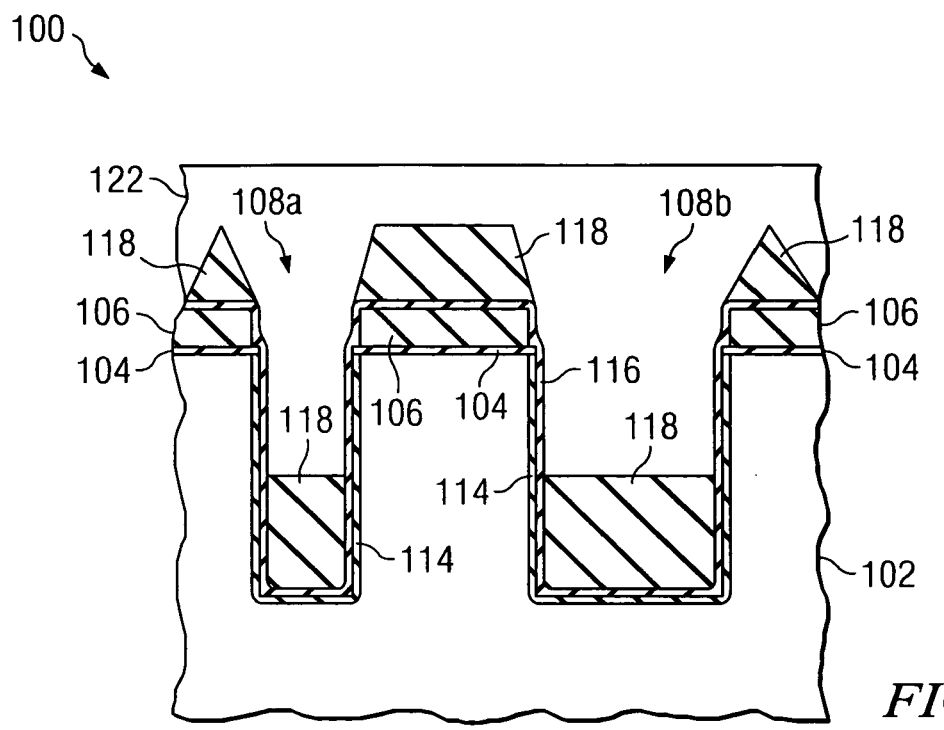

A masking material 122 is formed over the first insulating material 118 and over sidewalls of the nitride liner 116, as shown in FIG. 6. The masking material 122 preferably comprises a layer of photosensitive material, such as a photoresist, in this embodiment, that completely fills the plurality of trenches 108a and 108b, as shown. The masking material 122 preferably has a height of about 100 Angstroms or more over the highest points of the top surface of the first insulating material 118, for example.

Figure 7:
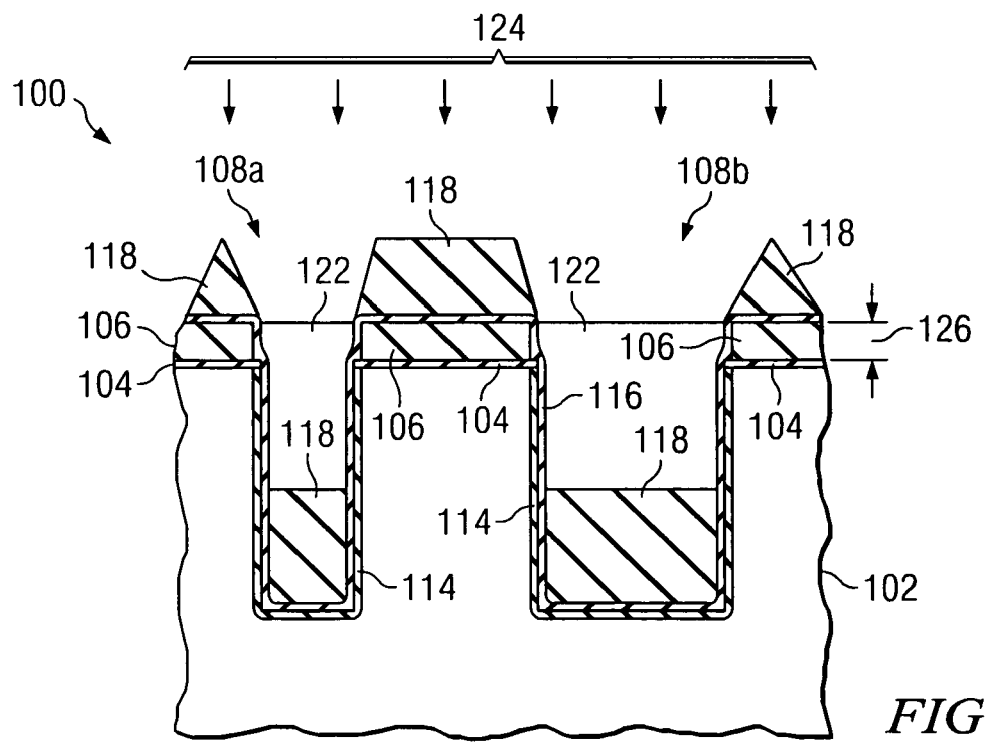

The masking material 122 is recessed using an etch process 124 to completely expose the peaks of the first insulating material 118 residing over the pad nitride 106, as shown in FIG. 7. The etch process 124 to recess the masking material 122 preferably comprises an oxygen plasma process that is a timed etch, for example. The etch process 124 may also comprise an etch process having an endpoint to detect when the pad nitride 106 or nitride liner 116 have been reached, for example. The etch process 124 preferably is performed using an ash tool having a very uniform ash front, for example.

A top portion of the masking material 122 is removed, to recess the masking material 122 and expose the peaks of the insulating material 118. The masking material 122 is preferably recessed to a height below the top surface of the nitride liner 116, as shown. More preferably, the masking material 122 is preferably recessed to a height between the top surface of the pad nitride 106 and the bottom surface of the pad nitride 106, as shown at 126. The nitride liner 116 the pad nitride 106 advantageously provide a large process margin for the removal of the top portion of the masking material 122 to completely expose the peaks of the first insulating material 118 over the top surface of the workpiece 102, for example.

The etch process 124 preferably comprises an isotropic etch process that etches away the masking material 122 until the masking material 122 comprises a top surface having a height disposed at or above the top surface of the workpiece 102, yet below a top surface of the pad nitride 106, in some embodiments, for example.

Preferably, the masking material 122 is not patterned using a mask or lithography method. Rather, the masking material 122 is preferably recessed using an etch process 124 that is substantially isotropic, until the peaks of the first insulating material 118 are completely exposed. The masking material 122 is preferably not left residing over any portions of the peaks of the first insulating material 118 over the top surface of the workpiece 102; e.g., the masking material 122 is not left remaining over a top surface or sidewalls of the peaks of the first insulating material 118.

Figure 8:
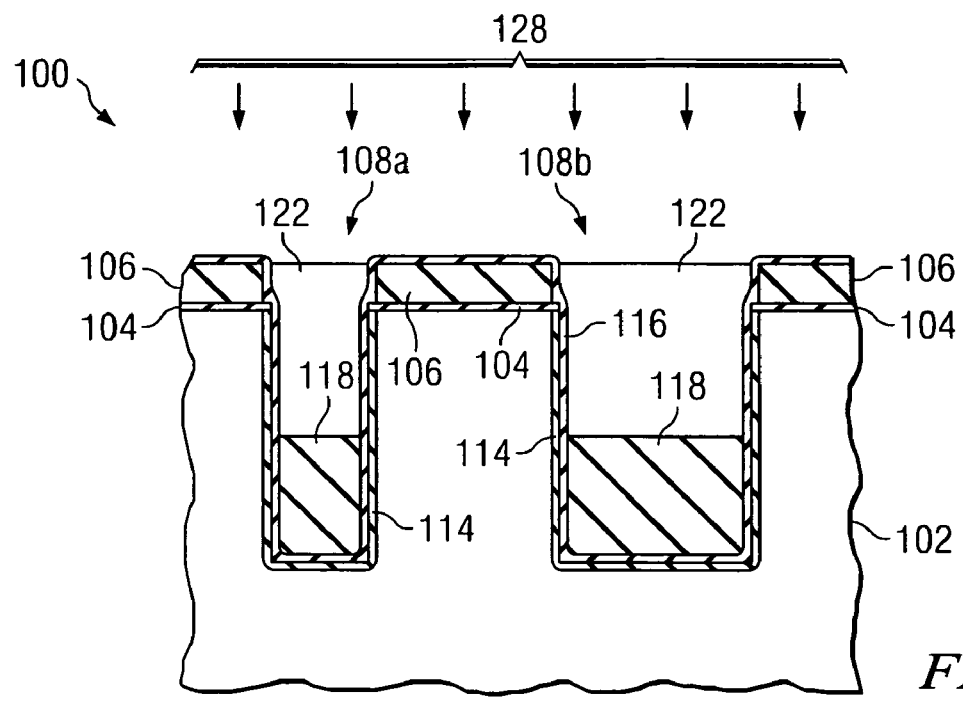

Then, a selective etch process 128 is used to remove the peaks of the first insulating material 118 from over the workpiece 102, as shown in FIG. 8. The etch process 128 is preferably a wet etch process selective to the first insulating material 118; for example, the etch process 128 is preferably adapted to etch away the material of the first insulating material 118, but not the nitride liner 116, pad nitride 106, or the masking material 122, as examples.

Because the peaks of the first insulating material 118 are completely exposed above the top surface of the pad nitride 106, the etch process 128 is made easier and the peaks of the first insulating material 118 are completely removed from above the top surface of the workpiece 102. Also, because a selective etch process 128 is used, the masking material 122 remains intact over the trenches 108a and 108b, preventing any portion of the first insulating material 118 in the lower portion of the trenches 108a and 108b from being etched away. The pad nitride 106 and nitride liner 118 provide a large process margin for the etch process 128 to remove the peaks of the first insulating material 118.

Advantageously, the topography of the peaks of the first insulating material 118 above the top surface of the workpiece 102 (or pad nitride 106 and/or the nitride liner 116) is used, rather than a lithography mask, to selectively etch away the first insulating material 118 from the top of the workpiece 102. Thus, the cost of a lithography mask and a patterning step is avoided, and the removal of the peaks of the first insulating material 118 is self-aligned. The topography of the peaks of the first insulating material 118 is used as a self-aligning mask, for example, in accordance with embodiments of the present invention, for the removal of the peaks of the first insulating material 118. The topography of the peaks of the first insulating material 118 is used to selectively protect the trench areas 108a and 108b during the removal of the peaks of the first insulating material 118, for example.

Figure 9:
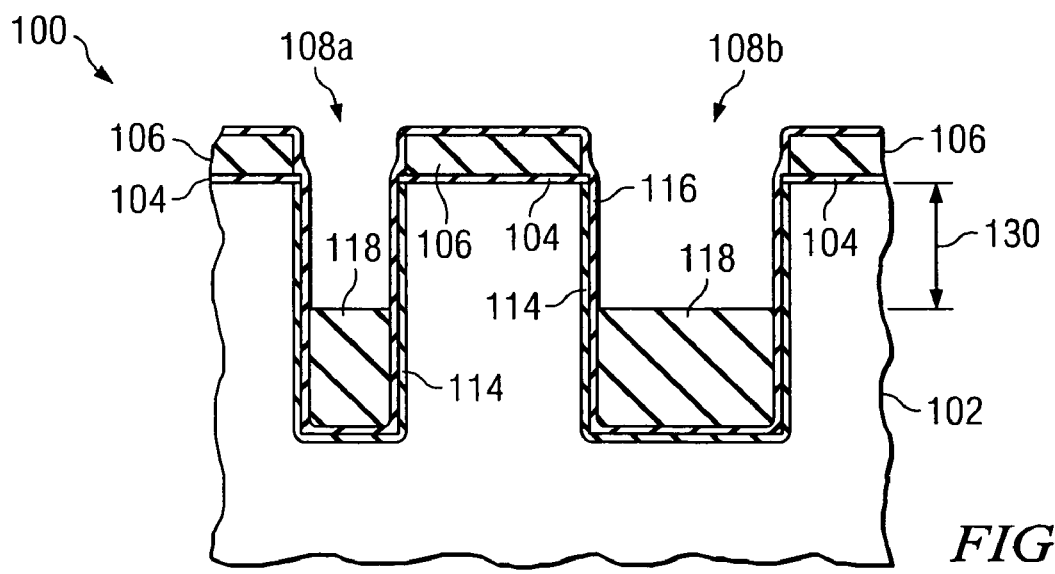

Next, the masking material 122 is removed, leaving the structure shown in FIG. 9, e.g., by an ash process or by exposure to oxygen plasma, as examples, although other methods may be used. The workpiece 102 is then cleaned, e.g., using a wet cleaning process. The first insulating material 118 is left remaining in the trenches 108a and 108b, and the peaks of the first insulating material 118 have been removed from over the workpiece 102, reducing the aspect ratio of a second fill process to fill the trenches 108a and 108b, for example. The first insulating material 118 preferably partially fills the trenches 108a and 108b at least halfway below the top surface of the workpiece 102, leaving the upper portion 130 of the workpiece 102 left remaining within the trenches 108a and 108b to be filled.

A second insulating material 132 is then deposited over the workpiece 102, as shown in FIG. 10. The second insulating material 132 preferably comprises the same material as the first insulating material 118 in some embodiments, for example, to avoid stress mismatches between the first and second insulating materials 118 and 132, for example. The second insulating material 132 preferably comprises an HDP oxide that forms peaks over the workpiece 102, e.g., over the pad nitride 106 or the nitride liner 116, as shown, although alternatively, the second insulating material 132 may comprise other insulating materials.

Figure 15:
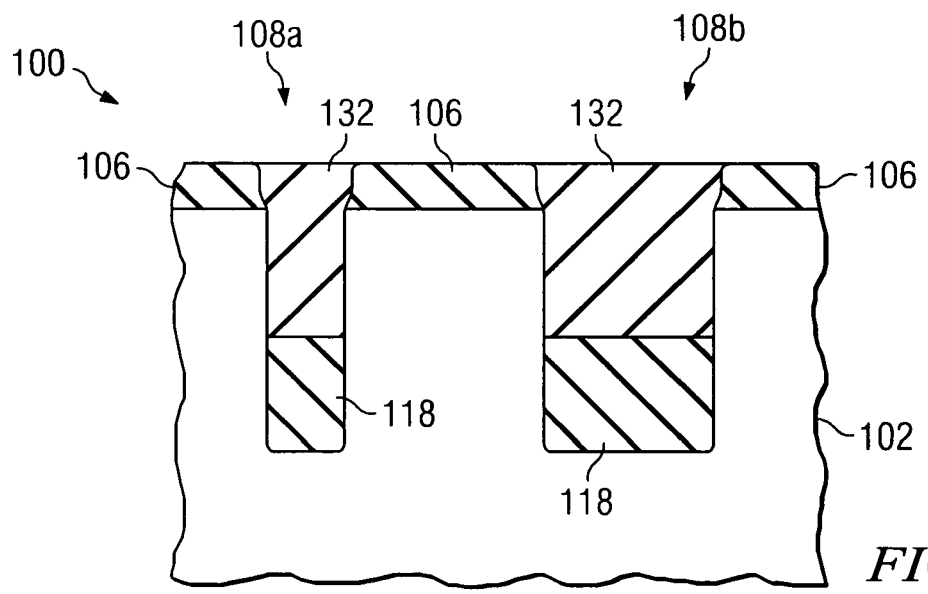
FIG. 15 shows a cross-sectional view of a semiconductor device manufactured using embodiments of the present invention, wherein isolation structures are void-free and are completely filled with insulating material after depositing a second insulating material over the first insulating material in a second fill step.

The second insulating material 132 may form depressions over the trenches 108a and 108b, as shown. Preferably, the lowest height 134 of the second insulating material 132 over the trenches 108a and 108b resides above the top surface of the pad nitride 106 and/or nitride liner 116 in some embodiments, as shown. Processing of the semiconductor device 100 is then continued, e.g., the top surface of the workpiece 102 may be exposed to a chemical mechanical polish (CMP) process to remove the peaks of the second insulating material 132 from over the pad nitride 106 and/or nitride liner 116, as shown in FIG. 15. Conductive material layers and insulating material layers may be formed over the semiconductor device 100 (not shown), and the manufacturing process is continued to complete the fabrication of the semiconductor device 100.

Figure 11:
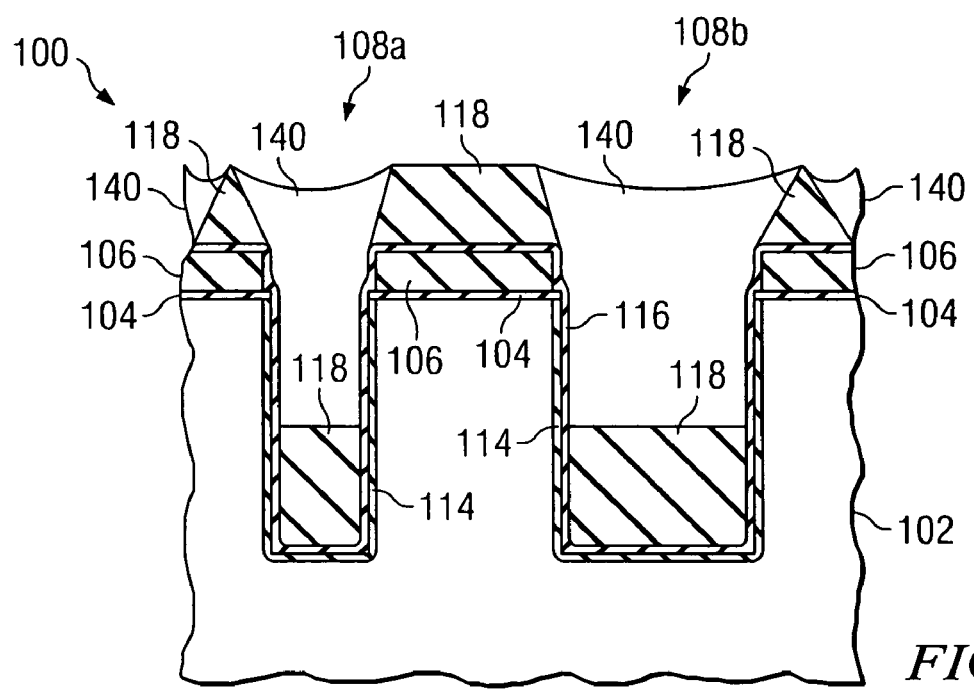
FIGS. 11 through 13 show cross-sectional views of another method of forming a semiconductor device at various stages of manufacturing in accordance with a preferred embodiment of the present invention, wherein the masking material comprises a bottom-anti-reflective coating (BARC) material.
Figure 12:
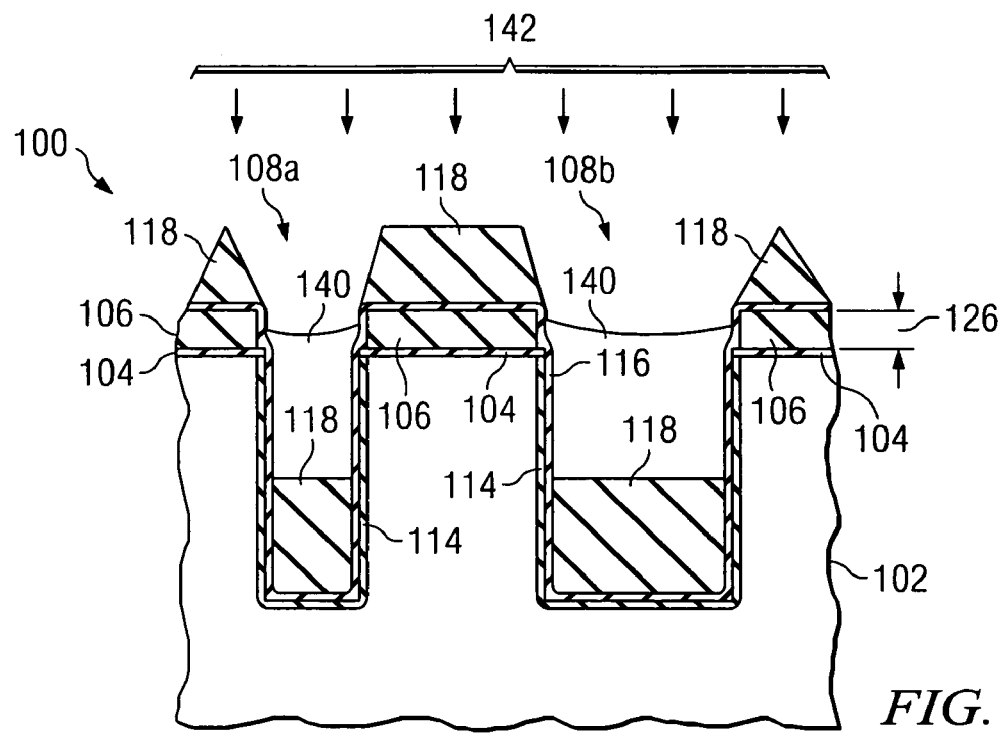
Figure 13:
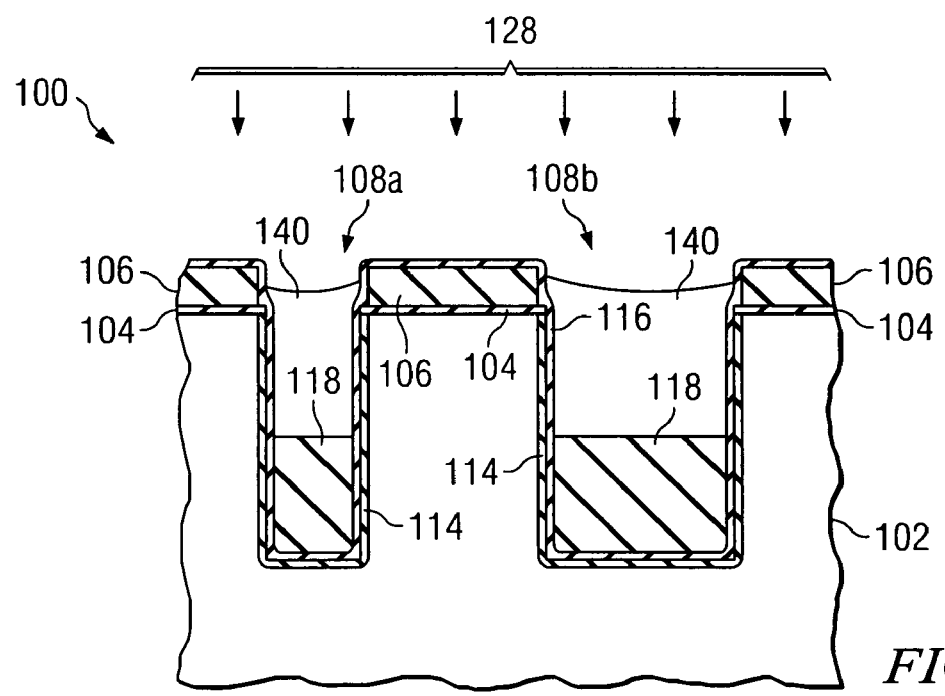

FIGS. 11 through 13 show cross-sectional views of another method of forming a semiconductor device 100 at various stages of manufacturing in accordance with a preferred embodiment of the present invention, wherein a masking material 140 comprises a bottom-anti-reflective coating (BARC) material. Like numerals are used for the various elements that were described in FIGS. 1 through 10, and to avoid repetition, each reference number shown in FIG. 10 is not described again in detail herein.

After the processing step shown in FIG. 5 in the previous embodiment, a masking material 140 preferably comprising a BARC material is formed over the workpiece 102. The BARC material 140 preferably comprises an organic material such as polystyrol, although other materials may also be used. The BARC material 140 is preferably a material that may be spun-on very evenly to just fill the spaces between the peaks of the first insulating material 140, as shown in FIG. 11. The BARC material 140 is adapted to fill topography up to the tallest peak on the workpiece 102, which in this case comprises the tips of the peaks of the first insulating material 118 over the nitride liner 116 and/or pad nitride 106, in some embodiments.

As in the previous embodiment, the top portion of the masking material comprising the BARC material 140 is removed, completely exposing the peaks of the first insulating material 140, as shown in FIG. 12. The etch process 142 to remove the top portion of the BARC material 140 preferably comprises an isotropic etch process, and preferably comprises an oxygen plasma flash process, although other removal processes may also be used. The etch process 142 preferably comprises about 30 to 60 seconds of exposure to $O_2$ plasma, for example.

The BARC material 140 may be left remaining over the trenches 108a and 108b to almost the top surface of the nitride liner 116 or the pad nitride 106, as shown. The nitride liner 116 and pad nitride 106 provide a large process margin for the removal of the top portion of the BARC material 140, for example. In some embodiments, the height of the BARC material 140 is preferably between the top of the pad nitride 106 and the bottom of the pad nitride 106, as shown at 126.

Next, an etch process 128 is used to remove the peaks of the first insulating material 118 from above the top surface of the nitride liner 116 or pad nitride 106, as shown in FIG. 13. The etch process 128 may comprise similar etch processes used to described FIG. 8, for example. The BARC material 140 is then removed, e.g., by an ash process or by an oxygen plasma etch, and the processing of the semiconductor device 100 is then continued, as shown in and described with reference to the embodiment shown in FIGS. 10 and 15.

Note that in some embodiments, the BARC material 140 comprises an organic compound that is adapted to fill narrow structures such as the trenches 108a and 108b within the workpiece 102, pad nitride 106, and pad oxide 104, without leaving a large amount of material on top of the protruding areas, e.g., the peaks of the first insulating material 118 over the pad nitride 106 and/or nitride liner 116. This is advantageous, because the etch process or recess process 128 may be shortened, and may comprise only a brief oxygen plasma flash process, for example.

In some embodiments, the BARC material 140 as deposited is only formed within the trenches 108a and 108b, and the BARC material 140 as deposited does not reside over any portion of the peaks of the first insulating material 118, as shown in FIG. 12, for example. Advantageously, an additional manufacturing step (e.g., etch process 128) to recess or lower the height of the BARC material 140 so that it does not reside over any portion of the peaks of the first insulating material 118 is not required, in these embodiments.

Figure 14:
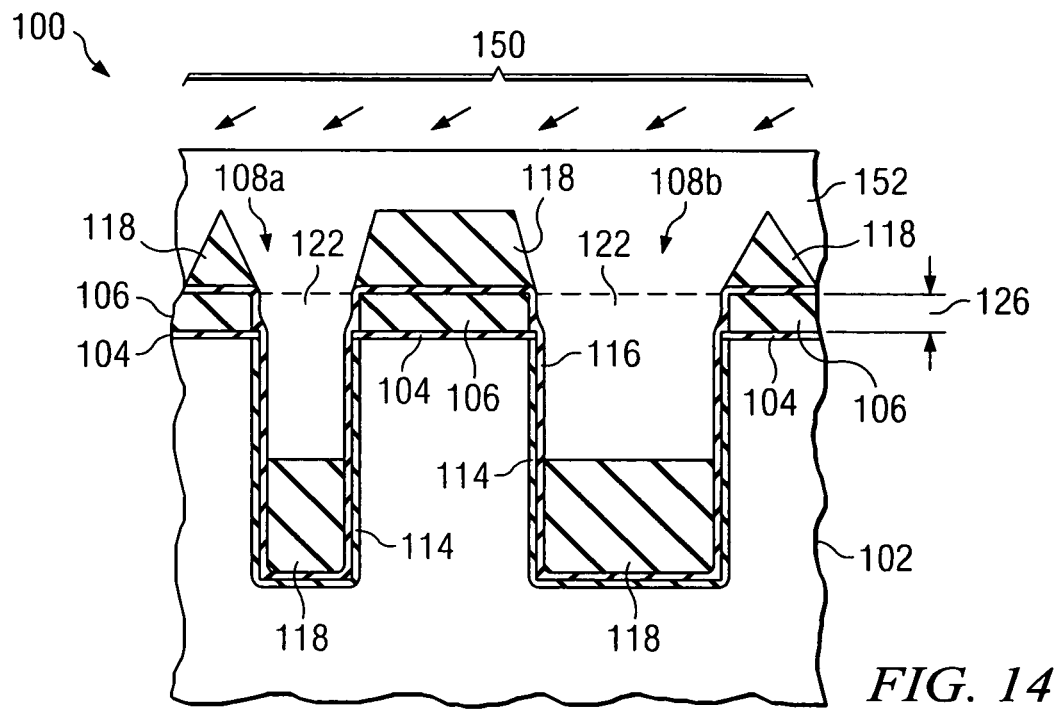
FIG. 14 shows a cross-sectional view of another embodiment of the present invention, wherein a partial exposure process is used to remove portions of the masking material, leaving the peaks of the first insulating material completely exposed.

FIG. 14 shows a cross-sectional view of another embodiment of the present invention. In this embodiment, after the processing steps shown in FIGS. 1 through 6, wherein the masking material 122 comprises a layer of photoresist, the layer of photoresist 122 is partially exposed, e.g., using a shortened exposure process or reduced dose exposure process. The amount of time of the exposure may be shortened, e.g., by about ½ or other amounts of time. The dose of the exposure process may be reduced, also to about ½ of the typical exposure dose used to fully expose the layer of photoresist, as examples, although other amounts of reduction of the exposure dose may also be used.

Alternatively, the partial exposure of the masking material 122 may be achieved by an exposure process at an angle with respect to the horizontal surface of the workpiece 102 rather than a direct exposure at 90 degrees with respect to the horizontal surface of the workpiece 102, as shown at 150. The angle of the exposure may comprise about 30 degrees or less, for example. The exposure may be made by a laser at about 193 nm, for example, although other wavelengths of energy may also be used. Exposing the masking material 122 at an angle may result in the shadow of the trenches preventing development of the photoresist within the trenches, for example. The exposure tool may be modified or adjusted to achieve the partial exposure of the layer of photoresist 122, for example.

The masking material 152 is developed after the exposure process, and the developed masking material 152 is removed, leaving unexposed and undeveloped portions of the masking material 122 are remaining in the trenches 108a and 108b. Only a top portion 152 of the layer of photoresist is exposed and developed, leaving the bottom portion of the masking material 122 remaining in the trenches 108a and 108b.

As in the other embodiments described herein, the peaks of the first insulating material 118 are left completely exposed after the partial exposure of the masking material 122, with no portion of the masking material 122 left residing on the top surface or sidewalls of the first insulating material 118 peaks, resulting in an improved etch of the peaks of the first insulating material 118 and a complete removal of the peaks of the first insulating material 118. The fabrication of the semiconductor device 100 is then continued, as described in FIGS. 8 through 10 and 15.

FIG. 15 shows a cross-sectional view of a semiconductor device 100 manufactured using embodiments of the present invention, wherein isolation structures are void-free and are completely filled with insulating material 118 and 132 after depositing a second insulating material 132 over the first insulating material 118 in a second fill step. Advantageously, in some embodiments, only two fill steps are required to fill the trenches 108a and 108b, e.g., with the first insulating material 118 and the second insulating material 132. One or more additional wet clean, wet etch and deposition steps may be avoided, (e.g., for each additional layer of insulating material avoided) in these embodiments.

Alternatively, in other embodiments, three or more fill steps may be required, by repeating the methods described herein, e.g., for higher aspect ratio trenches 108a and 108b. For example, one or more subsequent fill steps may comprise repeating the manufacturing steps shown in FIGS. 4 through 9, each filling the trenches 108a and 108b above the first insulating material 118 with additional insulating material, and the process is repeated until the trenches 108a and 108b are filled to the top surface of the workpiece 102, or to the top surface of the pad nitride 106 and/or nitride liner 116. Advantageously, very high aspect ratio trenches may be filled with insulating material, in accordance with embodiments of the present invention.

Note that in the embodiment shown in FIG. 15, the liners and pad oxide are not shown and may not necessarily be included. While not required by embodiments of the present invention, preferably, in some embodiments, a pad nitride 106 is disposed over the workpiece 102 to provide an increased process margin or process window for the removal of the masking material 122 or 140 to fully expose the peaks of the first insulating material 118 (see FIGS. 7 and 12), and also to provide for an increased process margin or process window for the etch process 128 (see FIG. 8) to remove the peaks of the first insulating material 118 from over the top surface of the pad nitride 106. The pad nitride 106 may be removed in subsequent manufacturing steps, for example, not shown. The pad nitride 106 serves as a stop layer for subsequent CMP step and provides an option of adjusting the step height of the trench oxide (e.g., the height of the second insulating material 132 within the trenches 108a and 108b) in relation to the top surface of the workpiece 102 by a subsequent deglaze step or wet etch process to remove the pad nitride 106 and pad oxide 104, for example, not shown.

Note that in the embodiments shown, the active areas (not shown) in the workpiece 102 between the trenches 108a and 108b may include transistors, complementary metal oxide semiconductor (CMOS) devices, memory devices, logic devices, power devices, capacitors, circuitry components, groups of circuitry components, and/or combinations thereof, as examples, not shown. Alternatively, the active areas may comprise other devices, for example.

The active areas may be formed in the workpiece 102 before the formation of the trenches 108a and 108b. The active areas may be formed in the workpiece 102 after the second fill step with the second insulating material 132, e.g., after the CMP process to remove the peaks of the second insulating material 132 from over the surface of the workpiece 102. Portions of the active areas may be formed in the workpiece 102 before the formation of the trenches 108a and 108b and other portions of the active areas may be formed in the workpiece 102 after the second fill step with the second insulating material 132, for example.

The first insulating material 118 and the second insulating material 132, and the oxide liner 114 and nitride liner 116, if included, within the trenches 108a and 108b comprise isolation structures of the semiconductor device 100. The isolation structures formed using the methods described herein may comprise STI regions, DT isolation regions, combinations of STI and DT isolation regions, or other types of isolation structures, as examples. For example, the isolation structures may comprise STI regions formed in CMOS devices, e.g., between n wells and p wells of PMOS transistors and NMOS transistors, respectively. The isolation structures may be formed in memory arrays or other types of semiconductor devices, for example. The isolation regions may provide electrical isolation between adjacent active regions or element regions formed within and/or over the workpiece 102, for example, wherein the active regions or element regions comprise capacitors, memory devices, transistors, power transistors, conductive lines (e.g., such as wordlines or bitlines of memory devices, or other conductive features), logic devices, power devices, portions of other electrical devices, circuitry components, groups of circuitry components, and/or combinations thereof, as examples.

Advantages of embodiments of the invention include providing novel methods of forming isolation structures of semiconductor devices 100. Three methods of completely removing a masking material from over peaks of HDP oxide (e.g., the first insulating material 118 peaks) and then selectively etching away the peaks of the HDP oxide are described herein. The methods result in improved fill processes with large process margins. Topography of the semiconductor device 100 is made more planar, which improves subsequent CMP processes, resulting in a reduced amount of time required for STI CMP and improved CMP uniformity, for example.

Due to the heavily decreased aspect ratio before the second insulating material 132 due to the removal of the peaks of the first insulating material 118, the trenches 108a and 108b may be filled in only two insulating material deposition steps. A void-free fill of the trenches 108a and 108b is easier to achieve by the use of embodiments of the present invention described herein. Embodiments of the present invention allow the use of non-conformal insulating materials such as HDP oxide in higher aspect ratio trenches 108a and 108b, prolonging the life of HDP oxide deposition equipment in existing semiconductor manufacturing facilities in the use in future technology nodes, which are expected to have progressively smaller feature sizes, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   providing a workpiece, the workpiece including a plurality of active area regions defined therein;
   forming at least one trench in the workpiece between at least two of the plurality of active area regions;
   depositing a first insulating material over the plurality of active area regions and the at least one trench of the workpiece, partially filling the at least one trench with the first insulating material and forming peaks of the first insulating material over the plurality of active area regions;
   forming a masking material over the first insulating material in the at least one trench, leaving the peaks of the first insulating material over the plurality of active area regions completely exposed;
   removing at least the peaks of the first insulating material from over the plurality of active area regions of the workpiece; and
   forming active areas in each of the plurality of active area regions, either before forming the at least one trench, or after depositing the second insulating material; or forming a first portion of active areas in each of the plurality of active area regions before forming the at least one trench, and forming a second portion of active areas in each of the plurality of active area regions after depositing the second insulating material.

2. The method according to claim 1, wherein forming the masking material comprises forming a layer of photoresist or forming a layer of a bottom anti-reflective coating (BARC).

3. The method according to claim 1, wherein depositing the first insulating material comprises depositing high density plasma (HDP) oxide.

4. The method according to claim 1, further comprising depositing a second insulating material over the plurality of active area regions and over the first insulating material in the at least one trench, filling the at least one trench with the second insulating material to a height above or at a top surface of the workpiece.

5. The method according to claim 1, wherein forming the masking material comprises forming the masking material over an entire surface of the first insulating material, and removing a top portion of the masking material, completely exposing the peaks of the first insulating material over the plurality of active area regions; or wherein forming the masking material comprises forming the masking material only over the first insulating material residing over the at least one trench.

6. A method of fabricating a semiconductor device, the method comprising:
   providing a workpiece;
   forming a plurality of active areas in the workpiece;
   forming at least one trench in the workpiece between at least two of the plurality of active areas, the at least one trench comprising sidewalls and an upper portion;
   depositing a first insulating material over the plurality of active areas and the at least one trench of the workpiece, partially filling the at least one trench with the first insulating material, lining the sidewalls of the upper portion of the at least one trench with the first insulating material, and forming peaks of the first insulating material over the plurality of active areas of the workpiece;
   etching the first insulating material, removing at least a portion of the first insulating material from the sidewalls of the upper portion of the at least one trench;
   forming a masking material over the first insulating material;
   removing a top portion of the masking material, completely exposing the peaks of the first insulating material over the plurality of active areas of the workpiece;
   removing the peaks of the first insulating material from over the plurality of active areas;
   removing the masking material; and
   depositing a second insulating material over the plurality of active areas.

7. The method according to claim 6, wherein depositing the first insulating material and depositing the second insulating material comprise forming an isolation region between the plurality of active areas in the at least one trench.

8. The method according to claim 6, wherein forming the isolation region comprises forming a shallow trench isolation (STI) region, a deep trench (DT) isolation region, or a combination thereof.

9. The method according to claim 6, wherein etching the first insulating material comprises isotropically etching the first layer of insulating material.

10. A method of fabricating a semiconductor device, the method comprising:
    providing a workpiece, the workpiece having a top surface;
    forming a plurality of active areas in the workpiece;
    forming a sacrificial material over the workpiece;
    forming at least one trench in the sacrificial material and in the workpiece between at least two of the plurality of active areas;
    depositing a first layer of high density plasma (HDP) oxide over the sacrificial material, partially filling the at least one trench with the first layer of HDP oxide and forming peaks of the first layer of HDP oxide over the sacrificial material;
    forming a first masking material over the first layer of HDP oxide;
    isotropically etching the first masking material until the first masking material comprises a top surface having a height disposed at or above the top surface of the workpiece, yet below a top surface of the sacrificial material, wherein isotropically etching the first masking material completely exposes the peaks of the first layer of HDP oxide over the sacrificial material;

etching the first layer of HDP oxide, removing the peaks of the first layer of HDP oxide from over the sacrificial material, leaving the sacrificial material exposed;

removing the first masking material; and forming a second layer of HDP oxide over the sacrificial material and over the first layer of HDP oxide in the at least one trench.

11. The method according to claim 10, wherein forming the second layer of HDP oxide comprises completely filling the at least one trench with the second layer of HDP oxide, further comprising chemically-mechanically polishing the workpiece to remove the second layer of HDP oxide from over the sacrificial material.

12. The method according to claim 10, wherein forming the second layer of HDP oxide comprises partially filling the at least one trench with the second layer of HDP oxide.

13. The method according to claim 12, further comprising:

forming a second masking material over the second layer of HDP oxide;

isotropically etching the second masking material until the second masking material comprises a top surface having a height disposed at or above the top surface of the workpiece, yet below a top surface of the sacrificial material, wherein isotropically etching the second masking material completely exposes the peaks of the second layer of HDP oxide over the sacrificial material;

etching the second layer of HDP oxide, removing the peaks of the second layer of HDP oxide from over the sacrificial material, leaving the sacrificial material exposed;

removing the second masking material; and forming a third layer of HDP oxide over the sacrificial material and over the second layer of HDP oxide in the at least one trench.

14. The method according to claim 13, wherein forming the third layer of HDP oxide comprises completely filling the at least one trench with the third layer of HDP oxide, further comprising chemically-mechanically polishing the workpiece to remove the third layer of HDP oxide from over the sacrificial material.

15. A method of fabricating a semiconductor device, the method comprising:

providing a workpiece;

forming a plurality of active areas in the workpiece;

forming a pad oxide over the workpiece;

forming a pad nitride over the pad oxide;

patterning the workpiece to form a plurality of trenches in the pad nitride, in the pad oxide, and in the workpiece between the plurality of active areas, the plurality of trenches comprising sidewalls;

forming an insulating liner over the sidewalls of the plurality of trenches;

depositing a first layer of high density plasma (HDP) oxide over the insulating liner, partially filling the plurality of trenches with the HDP oxide below a top surface of the workpiece and forming peaks of the first layer of HDP oxide over the pad nitride;

isotropically etching the first layer of HDP oxide, removing at least a portion of the first layer of HDP oxide from sidewalls of a top portion of the plurality of trenches;

forming a masking material over the first layer of HDP oxide;

removing a top portion of the masking material, completely exposing the peaks of the first layer of HDP oxide over the pad nitride;

etching away the completely exposed peaks of the first layer of HDP oxide, removing the peaks of the first layer of HDP oxide from over the pad nitride, leaving a top surface of the pad nitride exposed; and forming a second layer of HDP oxide over the pad nitride and over the first layer of HDP oxide in the plurality of trenches.

16. The method according to claim 15, wherein partially removing the masking material leaves sidewalls of a top portion of the pad nitride in the plurality of trenches exposed.

17. The method according to claim 15, wherein forming the masking material comprises forming polystyrol, and wherein partially removing the masking material comprises an oxygen plasma flash process.

18. The method according to claim 15, wherein forming the masking material comprises forming a layer of photoresist, and wherein partially removing the masking material comprises using an oxygen plasma process, a partial exposure of the resist, an exposure of the resist at an angle of about 30 degrees or less with respect to a horizontal surface of the workpiece, or a reduced dose exposure process.

19. The method according to claim 15, further comprising isotropically etching the pad nitride, reducing a width and thickness of the pad nitride, before forming the insulating liner over the sidewalls of the plurality of trenches.

20. A method of fabricating a semiconductor device, the method comprising:

providing a workpiece, the workpiece having a top surface;

forming a pad oxide over the top surface of the workpiece;

forming a pad nitride over the pad oxide;

forming a plurality of trenches in the pad nitride, the pad oxide, and the workpiece;

etching the pad nitride, reducing a width and thickness of the pad nitride;

forming an oxide liner on the workpiece on sidewalls and a bottom surface of the plurality of trenches;

forming a nitride liner over the oxide liner in the trenches, over sidewalls of the pad oxide, and over sidewalls and a top surface of the pad nitride;

depositing a first insulating material over the workpiece, partially filling the plurality of trenches and forming peaks of the first insulating material over the nitride liner;

isotropically etching the first insulating material, removing the first insulating material from an upper portion of sidewalls of the plurality of trenches;

forming a masking material over the first insulating material;

removing a top portion of the masking material, completely exposing the peaks of the first insulating material over the nitride liner;

removing the peaks of the first insulating material from over the nitride liner; and depositing a second insulating material over the workpiece, completely filling the plurality of trenches or partially filling the plurality of trenches.

21. The method according to claim 20, wherein depositing the second insulating material comprises depositing the same material as the first insulating material.

22. The method according to claim 20, wherein depositing the first insulating material comprises an anisotropic deposition process.

* * * * *